(12) United States Patent
Li et al.

(10) Patent No.: US 11,222,693 B2
(45) Date of Patent: Jan. 11, 2022

(54) DATA MANAGEMENT METHOD FOR MEMORY AND MEMORY APPARATUS USING THE SAME

(71) Applicant: MACRONIX INTERNATIONAL CO., LTD., Hsinchu (TW)

(72) Inventors: Yung-Chun Li, New Taipei (TW); Wei-Chen Wang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/035,885

(22) Filed: Sep. 29, 2020

(65) Prior Publication Data

US 2021/0375357 A1 Dec. 2, 2021

Related U.S. Application Data

(60) Provisional application No. 63/030,912, filed on May 27, 2020.

(51) Int. Cl.
| | |
|---|---|
| *G11C 16/34* | (2006.01) |
| *G11C 11/56* | (2006.01) |
| *G06F 12/02* | (2006.01) |
| *G11C 16/10* | (2006.01) |
| *G11C 16/16* | (2006.01) |

(52) U.S. Cl.
CPC ...... *G11C 11/5628* (2013.01); *G06F 12/0246* (2013.01); *G11C 11/5642* (2013.01); *G11C 16/10* (2013.01); *G06F 2212/2022* (2013.01); *G11C 16/16* (2013.01)

(58) Field of Classification Search
CPC .................................. G11C 16/3445

USPC ..................................... 365/185.28
See application file for complete search history.

(56) References Cited

U.S. PATENT DOCUMENTS 10,445,008 B2 10/2019 Li et al.
2017/0256320 A1* 9/2017 Lang ................. G11C 16/3445

FOREIGN PATENT DOCUMENTS

| TW | I629592 B | 7/2018 |
| TW | I661300 B | 6/2019 |

OTHER PUBLICATIONS

Chinese Language Office Action dated Jul. 5, 2021 in corresponding Taiwan Application No. 109133777.

* cited by examiner

*Primary Examiner* — Jason Lappas
(74) *Attorney, Agent, or Firm* — McClure, Qualey & Rodack, LLP

(57) ABSTRACT

A data management method for a memory is provided. The memory includes memory pages. Each of the memory pages includes memory cells. A data update command corresponding to a logical address is received. The logical address maps to a physical address of a target memory page before receiving the data update command. First and second reading voltages are applied to obtain at least a first and a second target memory cell to be sanitized in the target memory page of the memory pages, a first programming voltage is applied to change the logical state of the first target memory cell to a logical state with a higher threshold voltage, and a second programming voltage is applied to change the logical state of the second target memory cell to a logical state with a higher threshold voltage. The first programming voltage is different from the second programming voltage.

20 Claims, 12 Drawing Sheets

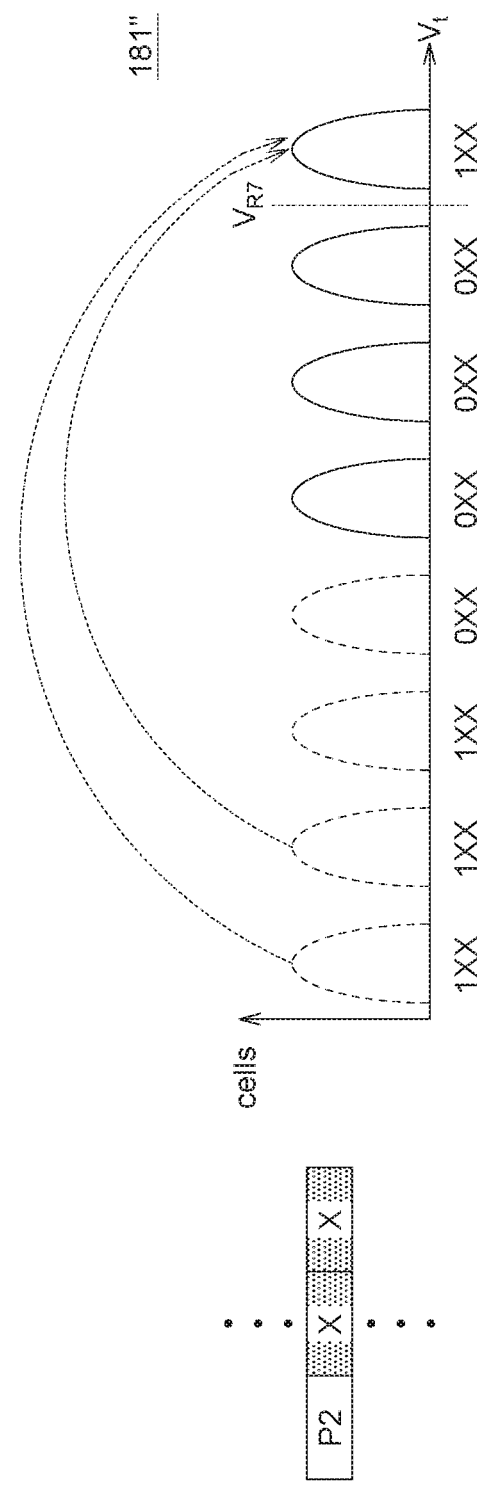

DATA MANAGEMENT METHOD FOR MEMORY AND MEMORY APPARATUS USING THE SAME

This application claims the benefit of U.S. provisional application Ser. No. 63/030,912, filed May 27, 2020, the subject matter of which is incorporated herein by reference.

FIELD OF THE INVENTION

The invention relates in general to a memory apparatus, and more particularly to a data management method for a memory and a memory apparatus using the same.

BACKGROUND OF THE INVENTION

In recent years, flash-based storage gradually replaces traditional hard disks to be storage of consumer electronics. Compared to hard disks, flash-based storage has some advantages, such as better performance, lower energy consumption, shock resistance, and compact size.

However, flash-based storage differs from hard disk in characteristic of out-of-place update, that is, the page cannot be re-written before erase operation in flash technology. When a user would like to update data which has written into a page of the flash-based storage, the user needs to write the updated data to a new blank page and the logical address is re-mapped to the new page to complete the data update.

In other words, when the written data needs to be updated, a new copy of the data is written (programmed) into a new blank page, and the logical address is re-mapped to this new page. Due to the aforementioned, one or more copies are generated and left in the flash-based storage after updating data.

The flash-based storage cannot directly erase the pages having those copies. Hackers could use those copies to rebuild data, and this is a hidden risk of data security. In addition, a method of erasing memory blocks after garbage collection would degrade the performance of the flash-based storage and shorten the lifetime of the flash-based storage. Therefore, there is a need to provide a data management method for a memory and a memory apparatus to remove data copies when the user updates data.

SUMMARY OF THE INVENTION

The invention is directed to a data management method for memory and a memory apparatus using the same. The logical state of the memory cells of the memory blocks could be changed by applying voltage. Accordingly, the data stored in the memory cells could be changed and the data could not be read correctly. Thus, the purpose of "deleting" data is achieved. The data security of memory could be improved and the hackers would not get data copies to rebuild data. The number of erasing memory blocks could be reduced, the lifetime of the memory could be extended, and the usage performance of the memory could be increased. When reading page, the number of applying reading voltage could be decreased, and thus the performance of the memory could be improved.

According to one aspect of the present invention, a data management method for a memory is provided. In Triple-Level Cell (TLC) memory, the memory includes a plurality of memory pages. Each of the memory pages includes a plurality of memory cells. Each of the memory cells includes a first storage bit, a second storage bit and a third storage bit. The memory cells include a first logical state, a second logical state, a third logical state, a fourth logical state, a fifth logical state, a sixth logical state, a seventh logical state, and an eighth logical state with a threshold voltage from low to high, respectively. The data management method includes the following steps. A data update command corresponding to a logical address is received. The logical address maps to a physical address of a target memory page before receiving the data update command. A first reading voltage and a second reading voltage are applied to obtain at least a first target memory cell and at least a second target memory cell to be sanitized in the target memory page of the memory pages, a first programming voltage is applied to change the logical state of the first target memory cell to one of the fifth logical state, the sixth logical state, the seventh logical state, and the eighth logical state, and a second programming voltage is applied to change the logical state of the second target memory cell to one of the fifth logical state, the sixth logical state, the seventh logical state, and the eighth logical state. The second programming voltage is different from the first programming voltage.

According to another aspect of the present invention, a memory apparatus is provided. The memory apparatus comprises a memory array and a sanitizer. The memory array includes a plurality of memory pages. Each of the memory pages includes a plurality of memory cells. Each of the memory cells includes a first storage bit, a second storage bit and a third storage bit. The memory cells include a first logical state, a second logical state, a third logical state, and a fourth logical state, a fifth logical state, a sixth logical state, a seventh logical state, and an eighth logical state with a threshold voltage from low to high, respectively. The sanitizer is used for receiving a data update command corresponding to a logical address, the logical address mapping to a physical address of a target memory page before receiving the data update command, and applying a first reading voltage and a second reading voltage to obtain at least a first target memory cell and at least a second target memory cell to be sanitized in the target memory page of the memory pages. The sanitizer is used for applying a first programming voltage to change the logical state of the first target memory cell to one of the fifth logical state, the sixth logical state, the seventh logical state, and the eighth logical state, and applying a second programming voltage to change the logical state of the second target memory cell to one of the fifth logical state, the sixth logical state, the seventh logical state, and the eighth logical state. The second programming voltage is different from the first programming voltage.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIGS. 10A-10C to 11A-11C show diagrams illustrating sanitization for triple-level cells (TLC) according to embodiments of this disclosure.

Figure 1:
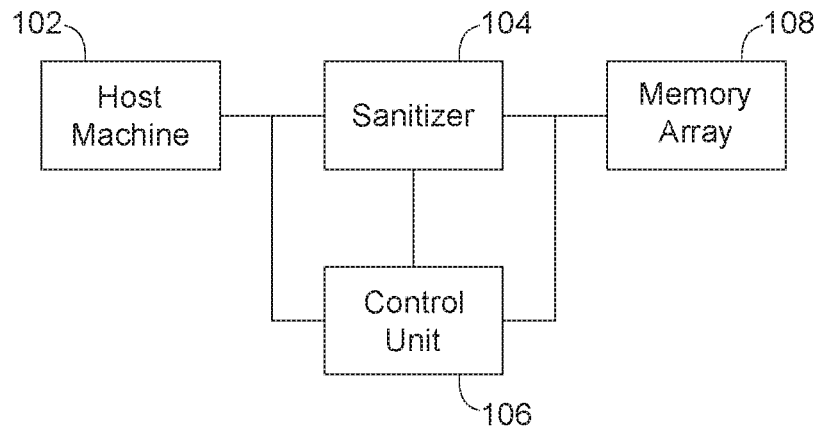
FIG. 1 shows a diagram illustrating a memory system according to an embodiment of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
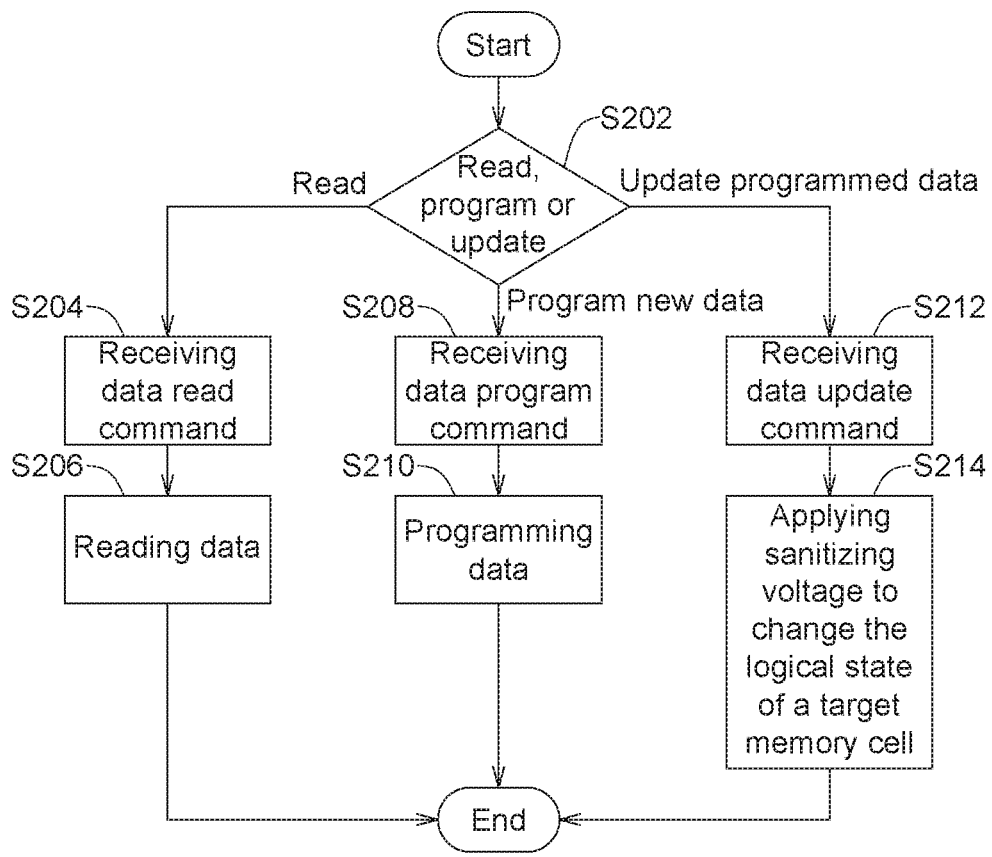
FIG. 2 illustrates a flow diagram for a data management method for a memory according to an embodiment of this disclosure.

Please refer to FIGS. 1 and 2. FIG. 1 shows a diagram illustrating a memory system 10 according to an embodiment of this disclosure. FIG. 2 illustrates a flow diagram for a data management method for a memory according to an embodiment of this disclosure. The memory system 10 includes a host machine 102, a sanitizer 104, a control unit 106, and a memory array 108. The host machine 102 is used to transmit read commands, write (program) commands, erase commands, or data update commands to the control unit 106. The sanitizer 104 is used to performing the data management method of this invention. The memory array 108 could be, for example, NAND flash memory or any other type of flash memory or storage device. The memory array 108 includes a plurality of memory blocks. Each of the memory blocks includes a plurality of memory pages, and each of the memory pages includes a plurality of memory cells. The host machine 102, the sanitizer 104 and the control unit 106 could be, for example, implemented by a chip, a circuit block in the chip, a firmware circuit, a circuit board having several electronic elements and wires, or a storage medium storing a number of program codes, and could also be implemented by performing a corresponding software, firmware or program using an electronic apparatus, such as a computer system, electronic devices, an embedded system, handhold devices, or a server.

At step S202, the control unit 106 determines the command transmitted from the host machine 102 is to read data, write (program) new data or update programmed data. When the command transmitted from the host machine 102 is to read data, at step S204, the control unit 106 receives a data read command, and then at step S206, the control unit 106 reads the data stored in the memory array 108.

When the command transmitted from the host machine 102 is to write (program) new data, at step S208, the control unit 106 receives a data program command. At step S210, the control unit 106 programs the new data into the memory array 108. The new data mentioned above means that the new data has not been stored in the memory array 108, and the flash translation layer (FTL) cannot find any memory block corresponding to the new data, that is, no copies of the new data are stored in the memory array 108.

When the command transmitted from the host machine 102 is to update programmed data, at step S212, the control unit 106 receives a data update command corresponding to a logical address, and the sanitizer 104 also receives the data update command corresponding to the logical address to update data. The flash translation layer has recorded a mapping relationship between a logical address and a physical address of a memory page where programmed data is stored. Thus, the logical address maps to a physical address before receiving the data update command. At step S214, the memory page where the programmed data is stored is taken as a target memory page, and the sanitizer 104 applies a sanitizing voltage to the target memory page of the memory array 108 to change the logical state of a target memory cell of the memory cells of the target memory page. Changing the logical state of the target memory cell of the memory cells in the target memory page of the memory pages is equivalent to re-program the target memory cell to change the data of the target memory cell. A similar effect as deleting data is achieved. Thus, hackers cannot use data copies to rebuild data. In this invention, "sanitize" and "sanitization" mean that the logical state of a target memory cell of a target memory page is changed and the target memory cell is re-programmed to change data stored into the target memory cell, and thus a similar effect as "deleting" data is achieved.

Please refer to FIGS. 3 to 9. FIGS. 3 to 9 show diagrams illustrating sanitization for triple-level cells (TLC) according to embodiments of this disclosure. FIGS. 3 to 9 further illustrate how the logical state of at least a target memory cell of the target memory page is changed by applying a sanitizing voltage.

Memory blocks 110, 120, 130, 140, 150, 160, and 170 in FIGS. 3 to 9 have the same or similar configuration. Each of memory blocks 110, 120, 130, 140, 150, 160, and 170 includes a plurality of word lines, and a word line includes a first page, a second page, and a third page. A page could include more than one memory cells. The memory cell of each of memory blocks 110, 120, 130, 140, 150, 160, and 170 is a triple-level cell including a first storage bit, a second storage bit and a third storage bit to store three bits. Storing the data of three pages in a word line is equivalent to storing three-bit data in memory cells of the same word line. The memory cells include a first logical state, a second logical state, a third logical state, a fourth logical state, a fifth logical state, a sixth logical state, a seventh logical state, and an eighth logical state with a threshold voltage from low to high, that is, the threshold voltage of memory cell on the first logical state is less than the threshold voltage of memory cell on the second logical state, the threshold voltage of memory cell on the second logical state is less than the threshold voltage of memory cell on the third logical state, and so on. For example, the first logical state is "111", the second logical state is "110", the third logical state is "100", the fourth logical state is "000", the fifth logical state is "010", the sixth logical state is "011", the seventh logical state is "001", and the eighth logical state is "101", For example, the first page is a high page, the second page is a mid-page and the third page written to the same word line is referred to as a low page. The first word line of memory blocks includes high page P1, mid-page P3 and low page P6. The second word line of memory blocks includes high page P2, mid-page P5 and low page P9. The third word line of memory blocks includes high page P4, mid-page P8 and low page P12. The fourth word line of memory blocks includes high page P7, mid-page P11 and low page P14. The fifth word line of memory blocks includes high page P10, mid-page P13 and low page P15. In order to simplify illustration, memory blocks 110, 120, 130, 140, 150, 160, and 170 only illustrate parts of memory pages.

Figure 3:
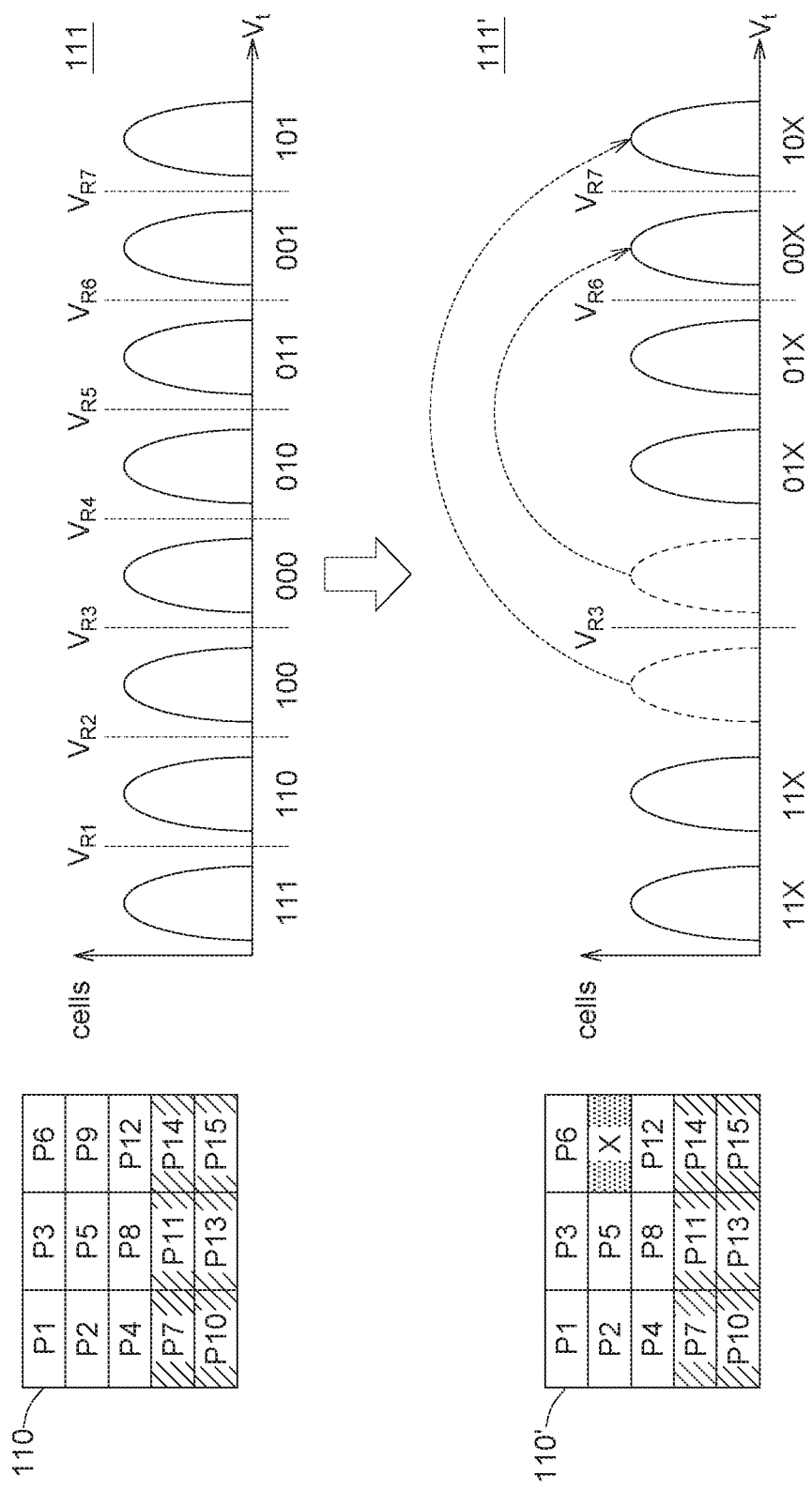
FIGS. 3 to 9 show diagrams illustrating sanitization for triple-level cells (TLC) according to embodiments of this disclosure.

Please refer to FIG. 3. In this embodiment, memory block 110 is a memory block before performing a sanitization on the memory block and memory block 110' is the memory block after performing the sanitization, i.e. memory block 110' presents sanitized memory block 110. High page P1, mid-page P3, low page P6, high page P2, mid-page P5, low page P9, high page P4, mid-page P8, and low page P12 of memory block 110 have been programmed with data, and high page P7, mid-page P11, low page P14, high page P10, mid-page P13, and low page P15 of memory block 110 have not been programmed.

Distribution 111 of FIG. 3 presents that high page P2, mid-page P5 and low page P9 of the second word line have been programmed with data. When low page P9 would be sanitized but the data of high page P2 and the data of mid-page P5 would be kept, the sanitizer 104 applies a second reading voltage $V_{R2}$, a second reading voltage $V_{R3}$ and a fourth reading voltage $V_{R4}$ to obtain a first target memory cell of the memory cells having the third logical state ("100") and a second target memory cell of the memory cells having the fourth logical state ("000"). Then, the sanitizer 104 applies a first programming voltage, by Incremental Step Pulse Programming (ISPP), to change the logical state of the first target memory cell of the memory cells from the third logical state ("100") to the eighth logical state ("10X") with a higher threshold voltage, and applies a second programming voltage, by ISPP, to change the logical state of the second target memory cell of the memory cells from the fourth logical state ("000") to the seventh logical state ("00X") with a higher threshold voltage. Because the first target memory cell is applied by a shot, the first target memory cell is programmed forward to the logical state with higher threshold voltage, i.e. the distribution is shifted right and higher than the fifth reading voltage $V_{R5}$. The data of low page P9 is changed from 0 to 1, and the data cannot be correctly read by applying the fifth reading voltage $V_{R5}$. Because the second target memory cell is applied by a shot, the second target memory cell is programmed forward to the logical state with higher threshold voltage, i.e. the distribution is shifted right and higher than the fifth reading voltage $V_{R5}$. The data of low page P9 is changed from 0 to 1, and the data cannot be correctly read by applying the fifth reading voltage $V_{R5}$.

For high page P2 and mid-page P5, the data of the memory cells of high page P2 and mid-page P5 is still 1 and not changed. A reading voltage $V_{R3}$ and a reading voltage $V_{R7}$ could be applied to read the data of the memory cells of high page P2. A reading voltage $V_{R6}$ could be applied to read the data of the memory cells of mid-page P5. Thus, the data written into low page P9 could be "deleted" and the data of high page P2 and the data of mid-page P5 could be kept.

Distribution 111' in FIG. 3 presents the distribution of the memory cells of high page P2 and mid-page P5 of the second word line after low page P9 of the second word line has been sanitized and the data of high page P2 and the data of mid-page P5 have been kept. Memory block 110' presents the memory block after low page P9 has been sanitized and the data of high page P2 and the data of mid-page P5 have been kept. An X appears on the position of low page P9 to present that the data of low page P9 cannot be read correctly. Reading the data of low page P9 incorrectly could be deemed as deleting the data of low page P9.

In this embodiment, after low page P9 is sanitized, the data of mid-page P5 could be read by merely applying the reading voltage $V_{R6}$. Compared to conventional way with applying the second reading voltage $V_{R2}$, the fourth reading voltage $V_{R2}$, and the sixth reading voltage $V_{R6}$ to read the data of mid-page P5, the present invention improves the reading performance of the memory. The sixth reading voltage $V_{R6}$ is greater than the second reading voltage $V_{R2}$ and the fourth reading voltage $V_{R4}$.

Figure 4:
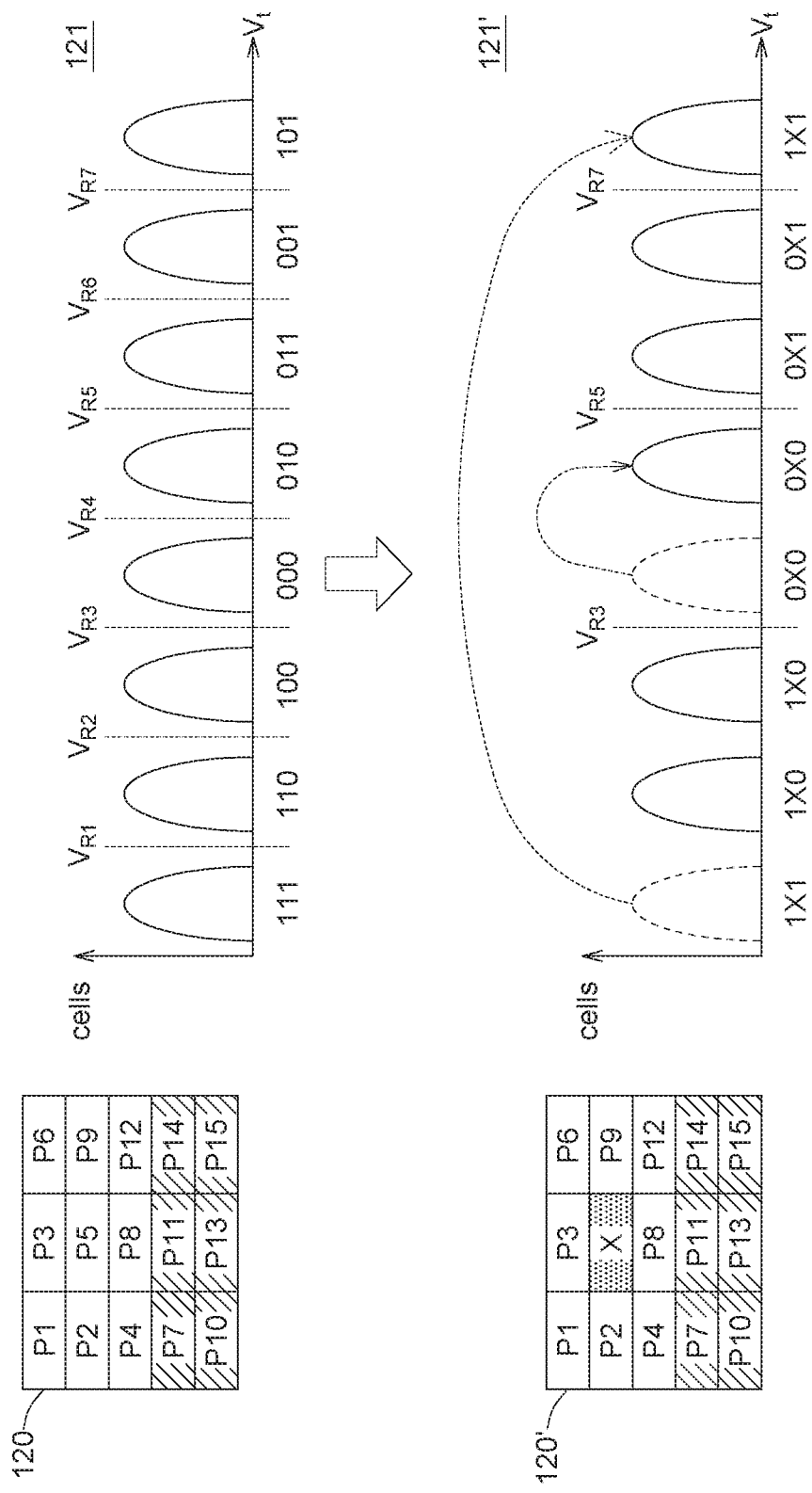

Please refer to FIG. 4. In this embodiment, memory block 120 is a memory block before performing a sanitization on the memory block and memory block 120' is the memory block after performing the sanitization, i.e. memory block 120' presents sanitized memory block 120. High page P1, mid-page P3, low page P6, high page P2, mid-page P5, low page P9, high page P4, mid-page P8, and low page P12 of memory block 120 have been programmed with data, and high page P7, mid-page P11, low page P14, high page P10, mid-page P13, and low page P15 of memory block 120 have not been programmed.

Distribution 121 of FIG. 4 presents that high page P2, mid-page P5 and low page P9 of the second word line have been programmed with data. When mid-page P5 would be sanitized but the data of high page P2 and the data of low page P9 would be kept, the sanitizer 104 applies a first reading voltage $V_{R1}$, a third reading voltage $V_{R3}$ and a fourth reading voltage $V_{R4}$ to obtain a first target memory cell of the memory cells having the first logical state ("100") and a second target memory cell of the memory cells having the fourth logical state ("000"). Then, the sanitizer 104 applies a first programming voltage, by ISPP, to change the logical state of the first target memory cell of the memory cells from the first logical state ("111") to the eighth logical state ("1X1") with a higher threshold voltage, and applies a second programming voltage, by ISPP, to change the logical state of the second target memory cell of the memory cells from the fourth logical state ("000") to the fifth logical state ("OXO") with a higher threshold voltage. Because the first target memory cell is applied by a shot, the first target memory cell is programmed forward to the logical state with higher threshold voltage, i.e. the distribution is shifted right and higher than the second reading voltage $V_{R2}$. The data of mid-page P5 is changed from 1 to 0, and the data cannot be correctly read by applying the second reading voltage $V_{R2}$. Because the second target memory cell is applied by a shot, the second target memory cell is programmed forward to the logical state with higher threshold voltage, i.e. the distribution is shifted right and higher than the fourth reading voltage $V_{R4}$. The data of mid-page P5 is changed from 0 to 1, and the data cannot be correctly read by applying the fourth reading voltage $V_{R4}$. The fourth reading voltage $V_{R4}$ is greater than the second reading voltage $V_{R2}$.

For high page P2 and mid-page P5, the data of the memory cells of high page P2 and mid-page P5 is still 1 and not changed. A reading voltage $V_{R3}$ and a reading voltage $V_{R7}$ could be applied to read the data of the memory cells of high page P2. A reading voltage $V_{R5}$ could be applied to read the data of the memory cells of low page P9. Thus, the data written into mid-page P5 could be "deleted" and the data of high page P2 and the data of low page P9 could be kept.

Distribution 121' in FIG. 4 presents the distribution of the memory cells of high page P2 and low page P9 of the second word line after mid-page P5 of the second word line has been sanitized and the data of high page P2 and the data of low page P9 have been kept. Memory block 120' presents the memory block after mid-page P5 has been sanitized and the data of high page P2 and the data of low page P9 have been kept. An X appears on the position of mid-page P5 to present that the data of mid-page P5 cannot be read correctly. Reading the data of mid-page P5 incorrectly could be deemed as deleting the data of mid-page P5.

In this embodiment, after mid-page P5 is sanitized, the data of low page P9 could be read by merely applying the reading voltage $V_{R5}$. Compared to conventional way with applying the first reading voltage $V_{R1}$ and the fifth reading voltage $V_{R5}$ to read the data of low page P9, the present invention improves the reading performance of the memory. The fifth reading voltage $V_{R5}$ is greater than the first reading voltage $V_{R1}$.

Figure 5:
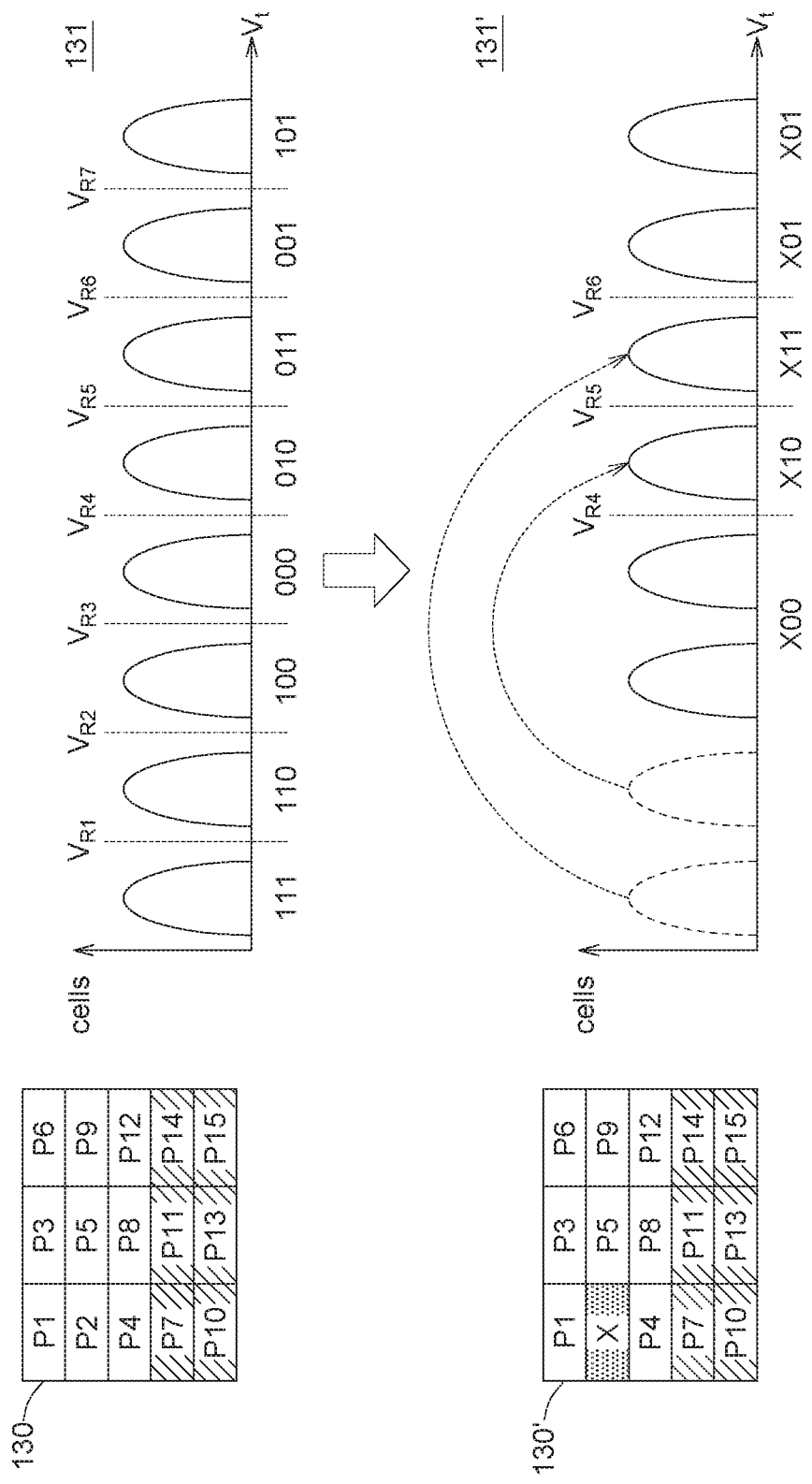

Please refer to FIG. 5. In this embodiment, memory block 130 is a memory block before performing a sanitization on the memory block and memory block 130' is the memory block after performing the sanitization, i.e. memory block 130' presents sanitized memory block 130. High page P1, mid-page P3, low page P6, high page P2, mid-page P5, low page P9, high page P4, mid-page P8, and low page P12 of memory block 130 have been programmed with data, and high page P7, mid-page P11, low page P14, high page P10, mid-page P13, and low page P15 of memory block 130 have not been programmed.

Distribution 131 of FIG. 5 presents that high page P2, mid-page P5 and low page P9 of the second word line have been programmed with data. When high page P2 would be sanitized but the data of mid-page P5 and the data of low page P9 would be kept, the sanitizer 104 applies a first reading voltage $V_{R1}$ and a second reading voltage $V_{R2}$ to obtain a first target memory cell of the memory cells having the first logical state ("111") and a second target memory cell of the memory cells having the second logical state ("110"). Then, the sanitizer 104 applies a first programming voltage, by ISPP, to change the logical state of the first target memory cell of the memory cells from the first logical state ("111") to the sixth logical state ("X11") with a higher threshold voltage, and applies a second programming voltage, by ISPP, to change the logical state of the second target memory cell of the memory cells from the second logical state ("110") to the fifth logical state ("X10") with a higher threshold voltage. Because the first target memory cell is applied by a shot, the first target memory cell is programmed forward to the logical state with higher threshold voltage, i.e. the distribution is shifted right and higher than the third reading voltage $V_{R3}$. The data of high page P2 is changed from 1 to 0, and the data cannot be correctly read by applying the third reading voltage $V_{R3}$. Because the second target memory cell is applied by a shot, the second target memory cell is programmed forward to the logical state with higher threshold voltage, i.e. the distribution is shifted right and higher than the third reading voltage $V_{R3}$. The data of high page P2 is changed from 1 to 0, and the data cannot be correctly read by applying the third reading voltage $V_{R3}$.

For mid-page P5 and low page P9, the data of the memory cells of mid-page P5 and low page P9 is still 1 and not changed. A reading voltage $V_{R4}$ and a reading voltage $V_{R6}$ could be applied to read the data of the memory cells of mid-page P5. A reading voltage $V_{R5}$ could be applied to read the data of the memory cells of low page P9. Thus, the data written into high page P2 could be "deleted" and the data of mid-page P5 and the data of low page P9 could be kept.

Distribution 131' in FIG. 5 presents the distribution of the memory cells of mid-page P5 and low page P9 of the second word line after high page P2 of the second word line has been sanitized and the data of mid-page P5 and the data of low page P9 have been kept. Memory block 130' presents the memory block after high page P2 has been sanitized and the data of mid-page P5 and the data of low page P9 have been kept. An X appears on the position of high page P2 to present that the data of high page P2 cannot be read correctly. Reading the data of high page P2 incorrectly could be deemed as deleting the data of high page P2.

In this embodiment, after high page P2 is sanitized, the data of mid-page P5 could be read by merely applying the reading voltage $V_{R4}$ and the reading voltage $V_{R6}$. Compared to conventional way with applying the second reading voltage $V_{R2}$, the fourth reading voltage $V_{R2}$, and the sixth reading voltage $V_{R6}$ to read the data of mid-page P5, the present invention improves the reading performance of the memory. After high page P2 is sanitized, the data of low page P9 could be read by merely applying the reading voltage $V_{R5}$. Compared to conventional way with applying the first reading voltage $V_{R1}$ and the fifth reading voltage $V_{R5}$ to read the data of low page P9, the present invention improves the reading performance of the memory. The sixth reading voltage $V_{R6}$ is greater than the fifth reading voltage $V_{R2}$, and the fifth reading voltage $V_{R5}$ is greater than the fourth reading voltage $V_{R4}$.

Figure 6:
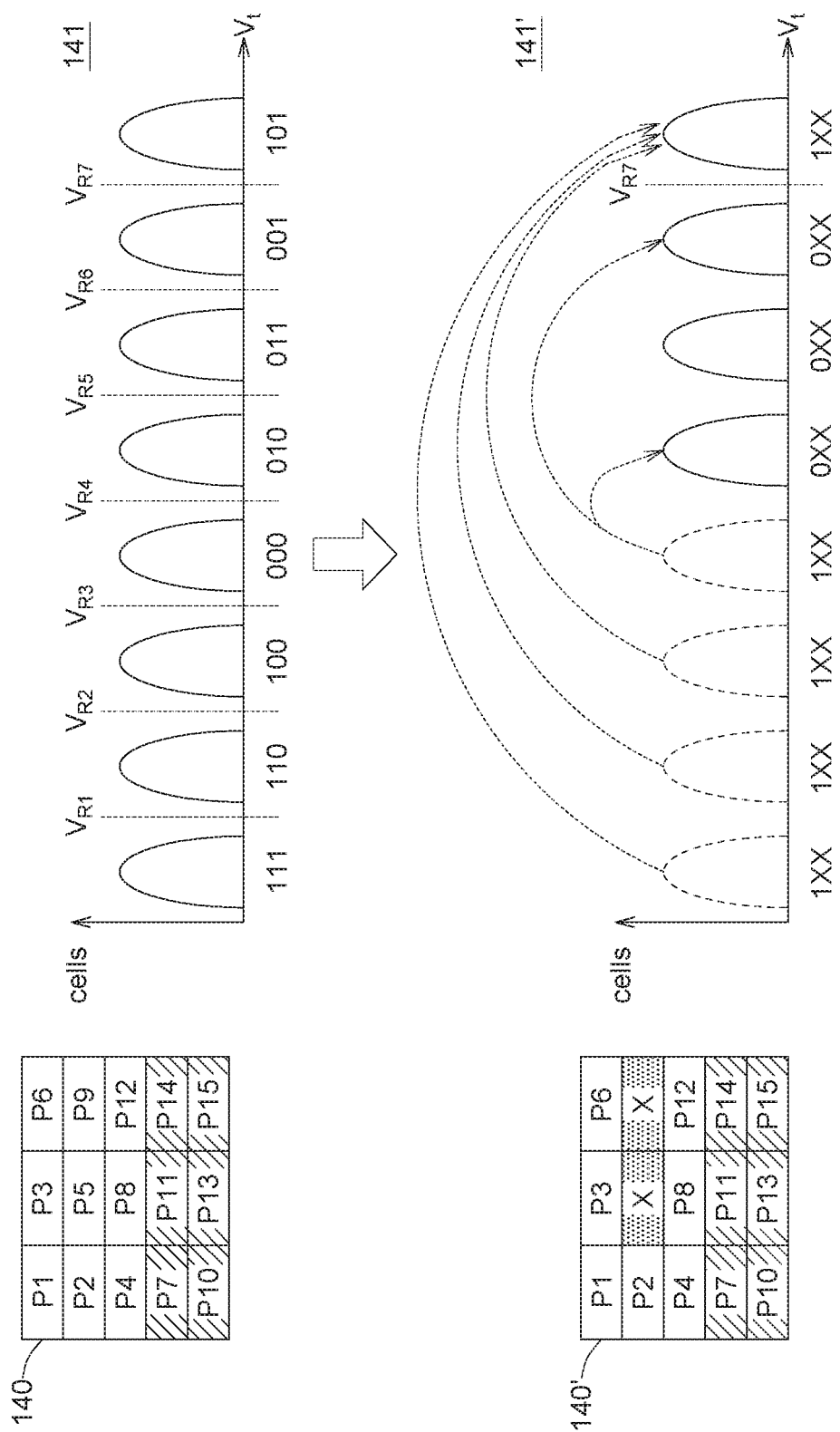

Please refer to FIG. 6. In this embodiment, memory block 140 is a memory block before performing a sanitization on the memory block and memory block 140' is the memory block after performing the sanitization, i.e. memory block 140' presents sanitized memory block 140. High page P1, mid-page P3, low page P6, high page P2, mid-page P5, low page P9, high page P4, mid-page P8, and low page P12 of memory block 140 have been programmed with data, and high page P7, mid-page P11, low page P14, high page P10, mid-page P13, and low page P15 of memory block 140 have not been programmed.

Distribution 141 of FIG. 6 presents that high page P2, mid-page P5 and low page P9 of the second word line have been programmed with data. When mid-page P5 and low page P9 would be sanitized but the data of high page P2 would be kept, the sanitizer 104 applies a third reading voltage $V_{R3}$ and a fourth reading voltage $V_{R4}$ to obtain three first target memory cells of the memory cells having the first logical state ("111"), the second logical state ("110"), and the third logical state ("100") and a second target memory cell of the memory cells having the fourth logical state ("000"). Then, the sanitizer 104 applies a first programming voltage, by ISPP, to change the logical states of the three first target memory cells of the memory cells from the first logical state ("111"), the second logical state ("110") and third logical state ("100") to the eighth logical state ("1XX") with a higher threshold voltage, and applies a second programming voltage, by ISPP, to change the logical state of the second target memory cell of the memory cells from the fourth logical state ("000") to the fifth logical state ("0XX"), the sixth logical state ("0XX") or the seventh logical state ("0XX") with a higher threshold voltage. Because the three first target memory cells are applied by a shot, the first target memory cells are programmed forward to the logical state with higher threshold voltage, i.e. the distribution is shifted right and higher than the third reading voltage $V_{R5}$. The data of low page P9 is changed from 0 to 1, and the data cannot be correctly read by applying the first reading voltage $V_{R1}$ and the fifth reading voltage $V_{R5}$. Because the second target memory cell is applied by a shot, the second target memory cell is programmed forward to the logical state with higher threshold voltage, i.e. the distribution is shifted right and higher than the fourth reading voltage $V_{R4}$. The data of mid-page P5 is changed from 0 to 1, and the data cannot be correctly read by applying the fourth reading voltage $V_{R4}$. The fourth reading voltage $V_{R4}$ is greater than the first reading voltage $V_{R1}$.

For high page P2, the data of the memory cells of high page P2 is still 1 and not changed. A reading voltage $V_{R7}$ could be applied to read the data of the memory cells of high page P2. Thus, the data written into mid-page P5 and low page P9 could be "deleted" and the data of high page P2 could be kept.

Distribution 141' in FIG. 6 presents the distribution of the memory cells of high page P2 of the second word line after mid-page P5 and low page P9 of the second word line has been sanitized and the data of high page P2 have been kept. Memory block 140' presents the memory block after mid-page P5 and low page P9 has been sanitized and the data of high page P2 have been kept. Two X appear on the positions of mid-page P5 and low page P9 to present that the data of mid-page P5 and low page P9 cannot be read correctly. Reading the data of mid-page P5 and low page P9 incorrectly could be deemed as deleting the data of mid-page P5 and low page P9.

In this embodiment, after mid-page P5 and low page P9 is sanitized, the data of high page P2 could be read by merely applying the reading voltage $V_{R7}$. Compared to conventional way with applying the third reading voltage $V_{R3}$ and the seventh reading voltage $V_{R7}$ to read the data of high page P2, the present invention improves the reading performance of the memory. The seventh reading voltage $V_{R7}$ is greater than the third reading voltage $V_{R3}$.

Figure 7:
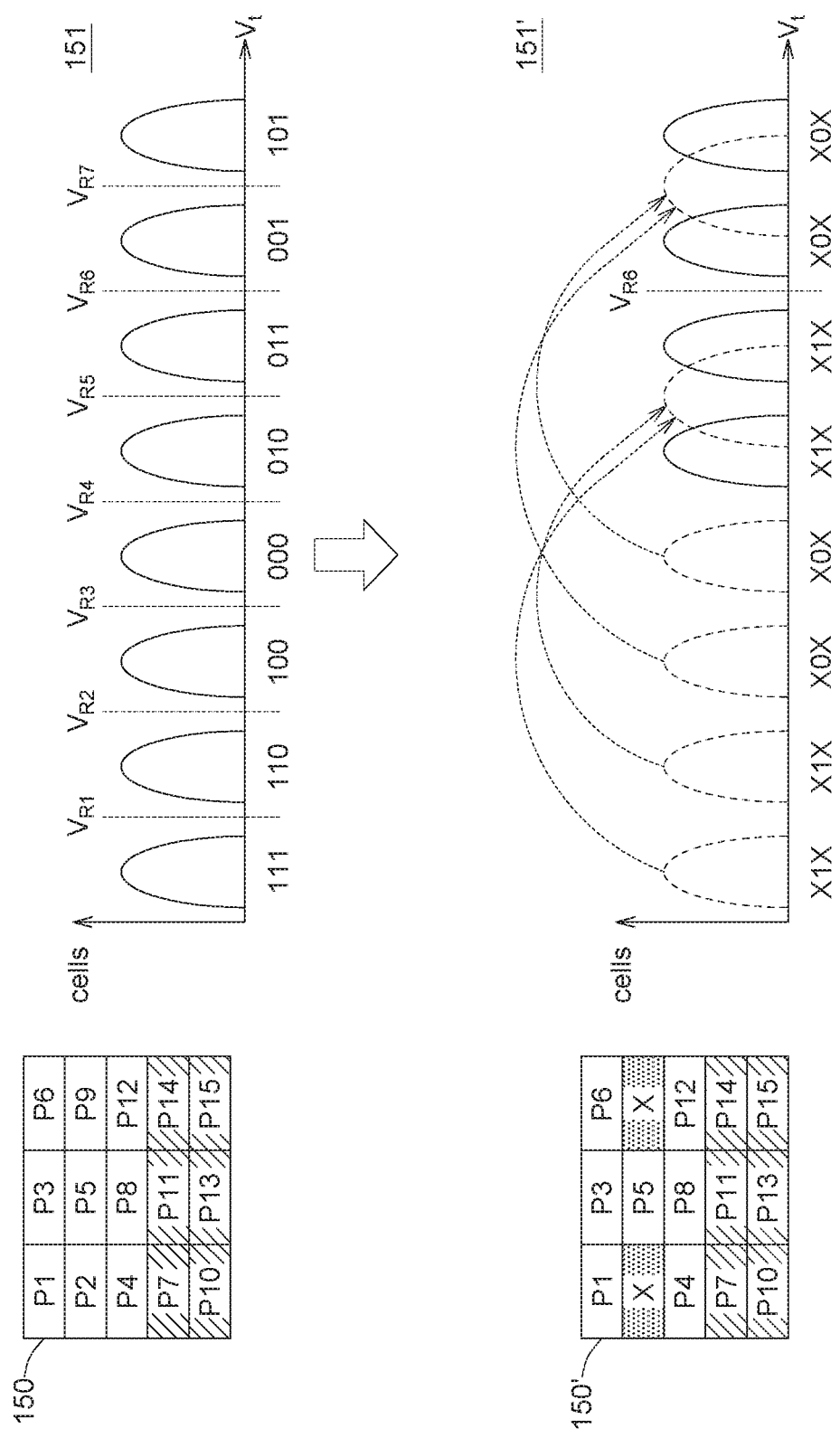

Please refer to FIG. 7. In this embodiment, memory block 150 is a memory block before performing a sanitization on the memory block and memory block 150' is the memory block after performing the sanitization, i.e. memory block 150' presents sanitized memory block 150. High page P1, mid-page P3, low page P6, high page P2, mid-page P5, low page P9, high page P4, mid-page P8, and low page P12 of memory block 150 have been programmed with data, and high page P7, mid-page P11, low page P14, high page P10, mid-page P13, and low page P15 of memory block 150 have not been programmed.

Distribution 151 of FIG. 7 presents that high page P2, mid-page P5 and low page P9 of the second word line have been programmed with data. When high page P2 and low page P9 would be sanitized but the data of mid-page P2 would be kept, the sanitizer 104 applies a second reading voltage $V_{R2}$ and a fourth reading voltage $V_{R4}$ to obtain two first target memory cells of the memory cells having the first logical state ("111") and the second logical state ("110"), and two second target memory cells of the memory cells having the third logical state ("100") and the fourth logical state ("000"). Then, the sanitizer 104 applies a first programming voltage, by ISPP, to change the logical states of the two first target memory cells of the memory cells from the first logical state ("111") and the second logical state ("110") to the fifth logical state ("X1X") with a higher threshold voltage, and applies a second programming voltage, by ISPP, to change the logical states of the two second target memory cells of the memory cells from the third logical state ("100") and the fourth logical state ("000") to the seventh logical state ("X0X") with a higher threshold voltage. Because the two first target memory cells are applied by a shot, the first target memory cells are programmed forward to the logical state with higher threshold voltage, i.e. the distribution is shifted right and higher than the third reading voltage $V_{R3}$. The data of high page P2 is changed from 1 to 0, and the data cannot be correctly read by applying the third reading voltage $V_{R3}$. Because the two second target memory cells are applied by a shot, the second target memory cells are programmed forward to the logical state with higher threshold voltage, i.e. the distribution is shifted right and higher than the fifth reading voltage $V_{R5}$. The data of low page P9 is changed from 0 to 1, and the data cannot be correctly read by applying the fifth reading voltage $V_{R5}$. The fifth reading voltage $V_{R5}$ is greater than the third reading voltage $V_{R3}$.

For mid-page P5, the data of the memory cells of mid-page P5 is still 1 and not changed. A reading voltage $V_{R6}$ could be applied to read the data of the memory cells of mid-page P5. Thus, the data written into high page P2 and low page P9 could be "deleted" and the data of mid-page P5 could be kept.

Distribution 151' in FIG. 7 presents the distribution of the memory cells of mid-page P5 of the second word line after high page P2 and low page P9 of the second word line has been sanitized and the data of mid-page P2 have been kept. Memory block 150' presents the memory block after high page P2 and low page P9 has been sanitized and the data of mid-page P5 have been kept. Two X appear on the positions of high page P2 and low page P9 to present that the data of high page P2 and low page P9 cannot be read correctly. Reading the data of high page P2 and low page P9 incorrectly could be deemed as deleting the data of high page P2 and low page P9.

In this embodiment, after high page P2 and low page P9 are sanitized, the data of mid-page P5 could be read by merely applying the reading voltage $V_{R6}$. Compared to conventional way with applying the second reading voltage $V_{R2}$, the fourth reading voltage $V_{R4}$ and the sixth reading voltage $V_{R6}$ to read the data of high page P2, the present invention improves the reading performance of the memory. The sixth reading voltage $V_{R6}$ is greater than the second reading voltage $V_{R2}$ and the fourth reading voltage $V_{R4}$.

Figure 8:
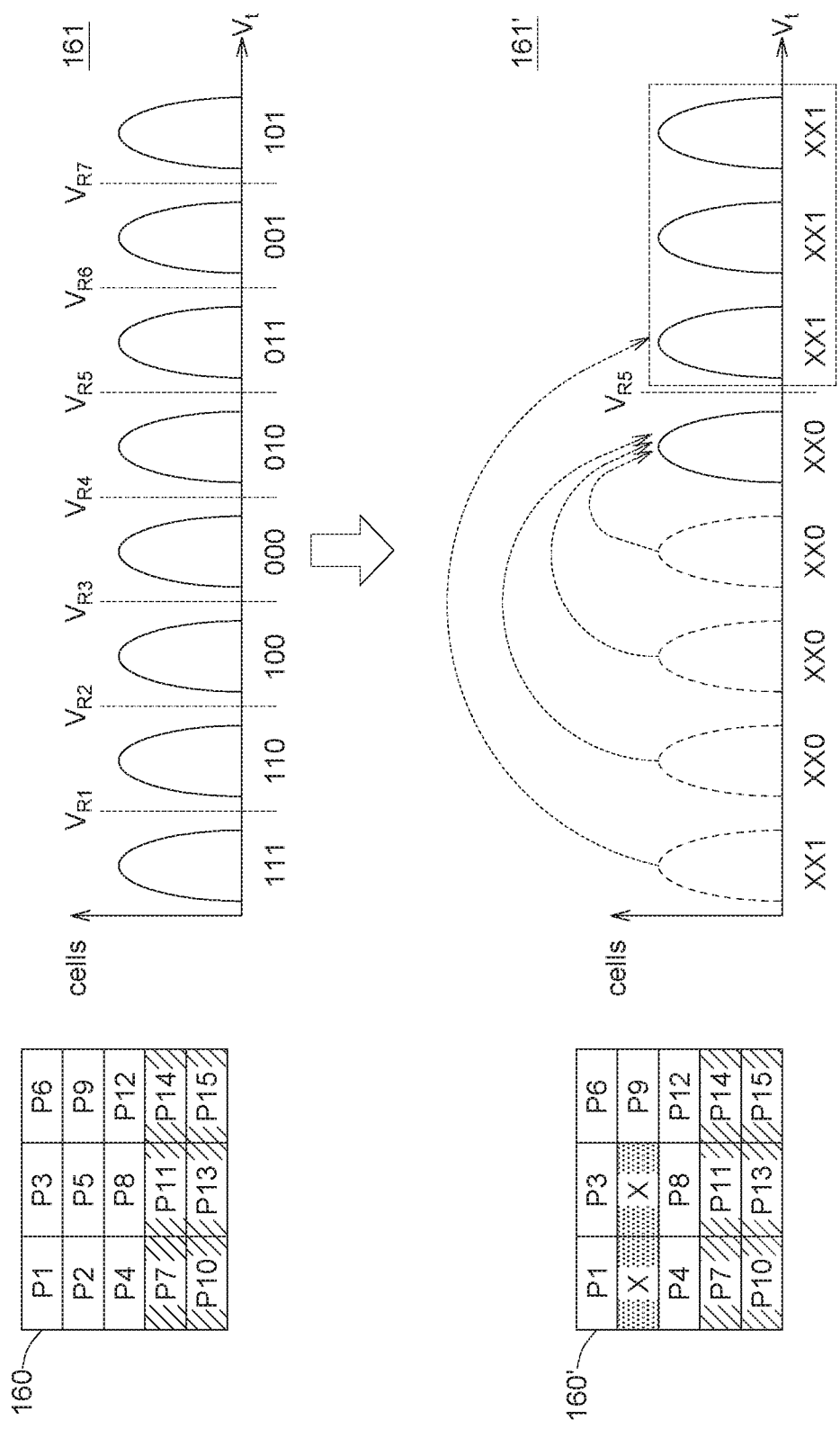

Please refer to FIG. 8. In this embodiment, memory block 160 is a memory block before performing a sanitization on the memory block and memory block 160' is the memory block after performing the sanitization, i.e. memory block 160' presents sanitized memory block 160. High page P1, mid-page P3, low page P6, high page P2, mid-page P5, low page P9, high page P4, mid-page P8, and low page P12 of memory block 160 have been programmed with data, and high page P7, mid-page P11, low page P14, high page P10, mid-page P13, and low page P15 of memory block 160 have not been programmed.

Distribution 161 of FIG. 8 presents that high page P2, mid-page P5 and low page P9 of the second word line have been programmed with data. When high page P2 and mid-page P5 would be sanitized but the data of low page P9 would be kept, the sanitizer 104 applies a first reading voltage $V_{R1}$ and a fourth reading voltage $V_{R4}$ to obtain a first target memory cell of the memory cells having the first logical state ("111"), and three second target memory cells of the memory cells having the second logical state ("110"), the third logical state ("100") and the fourth logical state ("000"). Then, the sanitizer 104 applies a first programming voltage, by ISPP, to change the logical state of the first target memory cell of the memory cells from the first logical state ("111") to the sixth logical state ("XX1") with a higher threshold voltage, and applies a second programming voltage, by ISPP, to change the logical states of the three second target memory cells of the memory cells from the second logical state ("110"), the third logical state ("100") and the fourth logical state ("000") to the fifth logical state ("XX0") with a higher threshold voltage. Because the first target memory cells are applied by a shot, the first target memory cell is programmed forward to the logical state with higher threshold voltage, i.e. the distribution is shifted right and higher than the third reading voltage $V_{R3}$. The data of high page P2 is changed from 1 to 0, and the data cannot be correctly read by applying the third reading voltage $V_{R3}$. Because the two second target memory cells are applied by a shot, the second target memory cells are programmed forward to the logical state with higher threshold voltage, i.e.

the distribution is shifted right and higher than the fourth reading voltage $V_{R4}$. The data of mid-page P5 is changed from 0 to 1, and the data cannot be correctly read by applying the fourth reading voltage $V_{R4}$. The fourth reading voltage $V_{R4}$ is greater than the third reading voltage $V_{R3}$.

For low page P9, the data of the memory cells of low page P9 is still 1 and not changed. A reading voltage $V_{R5}$ could be applied to read the data of the memory cells of low page P9. Thus, the data written into high page P2 and mid-page P5 could be "deleted" and the data of low page P9 could be kept.

Distribution 161' in FIG. 8 presents the distribution of the memory cells of low page P9 of the second word line after high page P2 and mid-page P5 of the second word line has been sanitized and the data of low page P9 have been kept. Memory block 160' presents the memory block after high page P2 and mid-page P5 has been sanitized and the data of low page P9 have been kept. Two X appear on the positions of high page P2 and mid-page P5 to present that the data of high page P2 and mid-page P5 cannot be read correctly. Reading the data of high page P2 and mid-page P5 incorrectly could be deemed as deleting the data of high page P2 and mid-page P5.

In this embodiment, after high page P2 and mid-page P5 are sanitized, the data of low page P9 could be read by merely applying the reading voltage $V_{R5}$. Compared to conventional way with applying the first reading voltage $V_{R1}$ and the fifth reading voltage $V_{R5}$ to read the data of low page P9, the present invention improves the reading performance of the memory. The fifth reading voltage $V_{R5}$ is greater than the first reading voltage $V_{R1}$.

Figure 9:
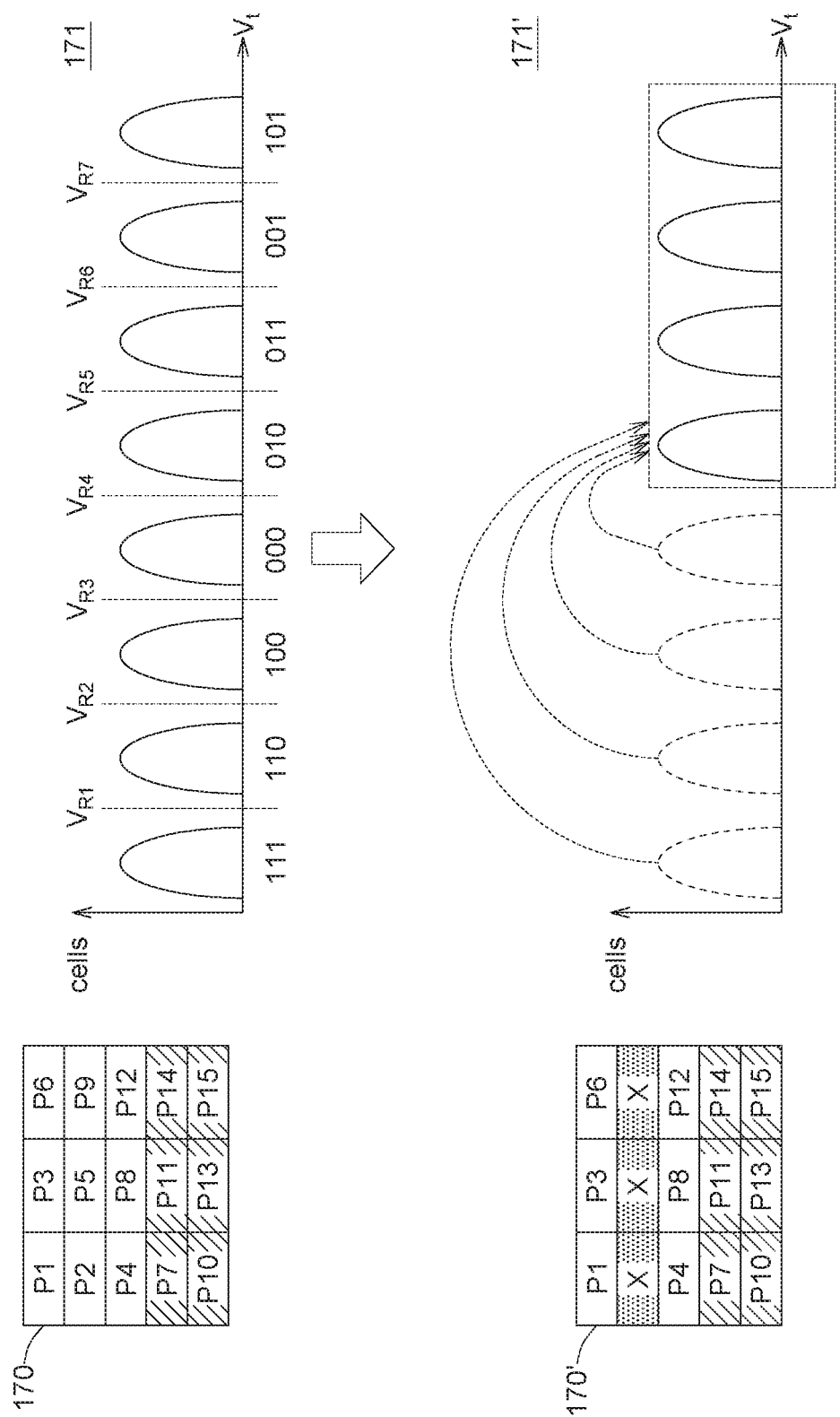

Please refer to FIG. 9. In this embodiment, memory block 170 is a memory block before performing a sanitization on the memory block and memory block 170' is the memory block after performing the sanitization, i.e. memory block 170' presents sanitized memory block 170. High page P1, mid-page P3, low page P6, high page P2, mid-page P5, low page P9, high page P4, mid-page P8, and low page P12 of memory block 170 have been programmed with data, and high page P7, mid-page P11, low page P14, high page P10, mid-page P13, and low page P15 of memory block 170 have not been programmed.

Distribution 171 of FIG. 9 presents that high page P2, mid-page P5 and low page P9 of the second word line have been programmed with data. When high page P2, mid-page P5 and low page P9 would be sanitized, the sanitizer 104 applies a fourth reading voltage $V_{R4}$ to obtain a first target memory cell of the memory cells having the first logical state ("111"), a second target memory cells of the memory cells having the second logical state ("110"), a third target memory cells of the memory cells having the third logical state ("100") and a fourth target memory cell of the memory cells having the fourth logical state ("000"). Then, the sanitizer 104 applies a programming voltage, by ISPP, to change the logical state of the first target memory cell of the memory cells from the first logical state ("111") to the logical state ("0") with a higher threshold voltage, the logical state of the second target memory cell of the memory cells from the second logical state ("110") to the logical state ("0") with a higher threshold voltage, the logical state of the third target memory cell of the memory cells from the third logical state ("100") to the logical state ("0") with a higher threshold voltage, and the logical state of the fourth target memory cell of the memory cells from the fourth logical state ("000") to the logical state ("0") with a higher threshold voltage. Because the four target memory cells are applied by a shot, the four target memory cells are programmed forward to the logical state with higher threshold voltage, i.e. the distribution is shifted right and higher than the fourth reading voltage $V_{R4}$. The data of high page P2, mid-page P5 and low page P9 is changed from 1 to 0, and the data cannot be correctly read by applying the fourth reading voltage $V_{R4}$. Thus, the data written into high page P2, mid-page P5 and low page P9 could be "deleted".

Distribution 171' in FIG. 9 presents the distribution of the memory cells of the second word line after high page P2, mid-page P5 and low page P9 of the second word line have been sanitized. Memory block 170' presents the memory block after high page P2, mid-page P5 and low page P9 have been sanitized. Three X appear on the positions of high page P2, mid-page P5 and low page P9 to present that the data of high page P2, mid-page P5 and low page P9 cannot be read correctly. Reading the data of high page P2, mid-page P5 and low page P9 incorrectly could be deemed as deleting the data of high page P2, mid-page P5 and low page P9.

Figure 10A:
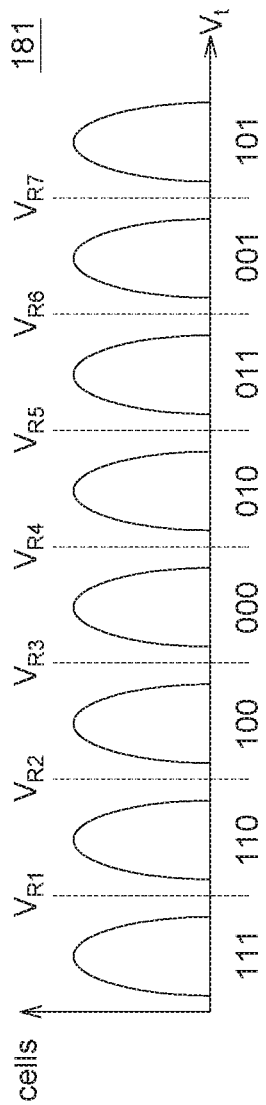
Figure 10A:
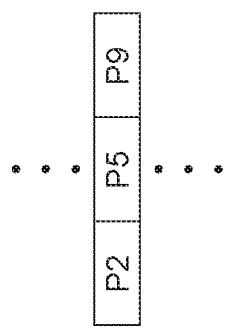
Figure 10B:
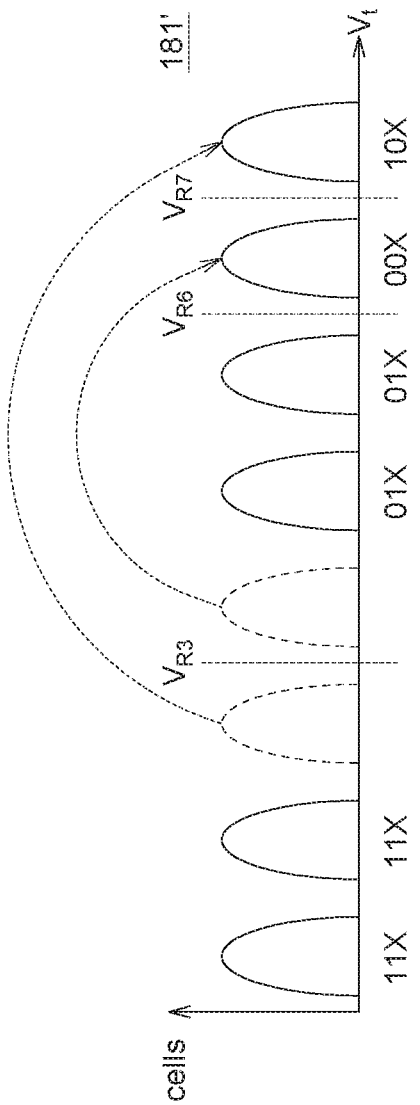
Figure 10B:
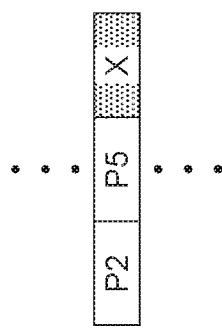

Please refer to FIGS. 10A-10C. In this embodiment, distribution 181 of FIG. 10A presents that high page P2, mid-page P5 and low page P9 of the second word line have been programmed with data. Distribution 181' in FIG. 10B presents the distribution of the memory cells of high page P2 and mid-page P5 of the second word line after low page P9 of the second word line has been sanitized and the data of high page P2 and mid-page P5 have been kept. Distribution 181" in FIG. 10C presents the distribution of the memory cells of high page P2 of the second word line after low page P9 of the second word line has been sanitized, then mid-page P5 of the second word line has been sanitized and the data of high page P2 has been kept. In FIG. 10B, when low page P9 would be sanitized but the data of high page P2 and mid-page P5 would be kept, the sanitizer 104 applies a second reading voltage $V_{R2}$, a second reading voltage $V_{R2}$ and a fourth reading voltage $V_{R4}$ to obtain two first target memory cells of the memory cells having the third logical state ("100") and the fourth logical state ("000") and two second target memory cells of the memory cells having the first logical state ("111") and the second logical state ("110"). Then, the sanitizer 104 applies a first programming voltage, by ISPP, to change the logical state of the first target memory cell of the memory cells from the third logical state ("100") to the eighth logical state ("10X") and the logical state of the first target memory cell of the memory cells from the fourth logical state ("000") to the seventh logical state ("00X"). Thus, the data written into low page P9 could be "deleted" and the data of high page P2 and mid-page P5 could be kept.

In FIG. 10C, when mid-page P5 would be sanitized but the data of high page P2 would be kept, the sanitizer 104 applies a second programming voltage, by a ISPP, to change the logical state of the second target memory cell of the memory cells from the first logical state ("11X") to the eighth logical state ("1XX") with a higher threshold voltage and the logical state of the second target memory cell of the memory cells from the second logical state ("1XX") to the eighth logical state ("1XX") with a higher threshold voltage. Thus, the data written into mid-page P5 could be "deleted" and the data of high page P2 could be kept.

Figure 11A:
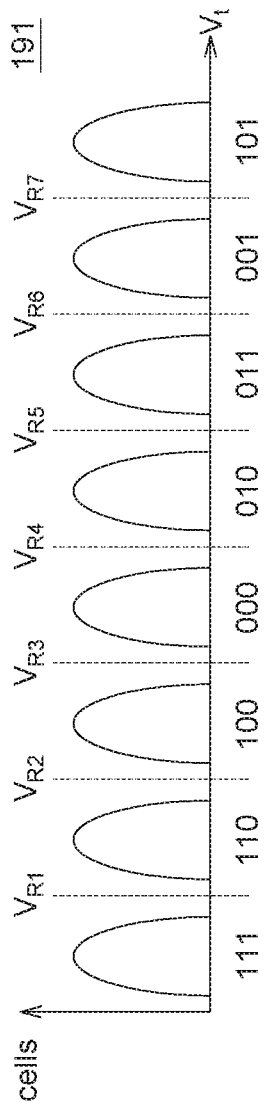
Figure 11A:
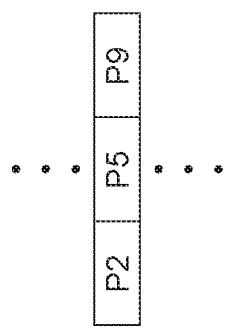
Figure 11B:
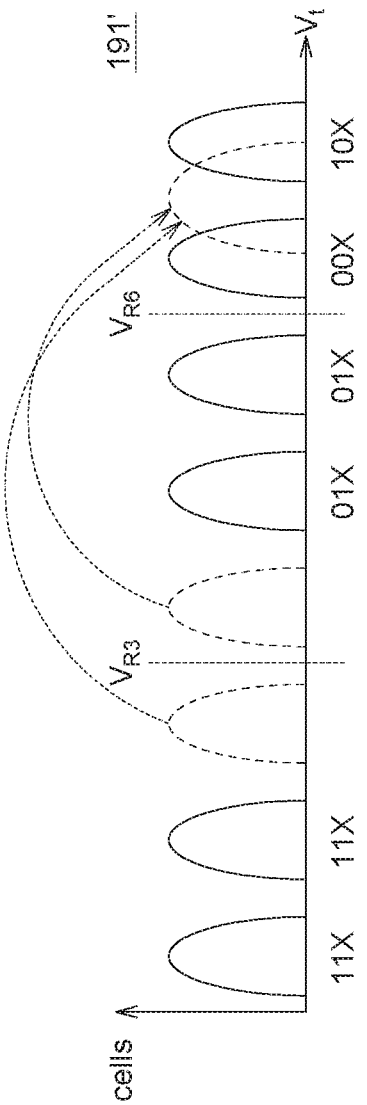
Figure 11B:
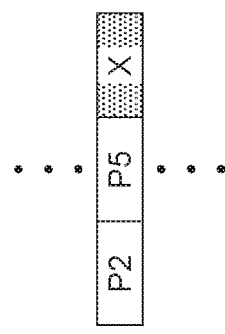
Figure 11C:
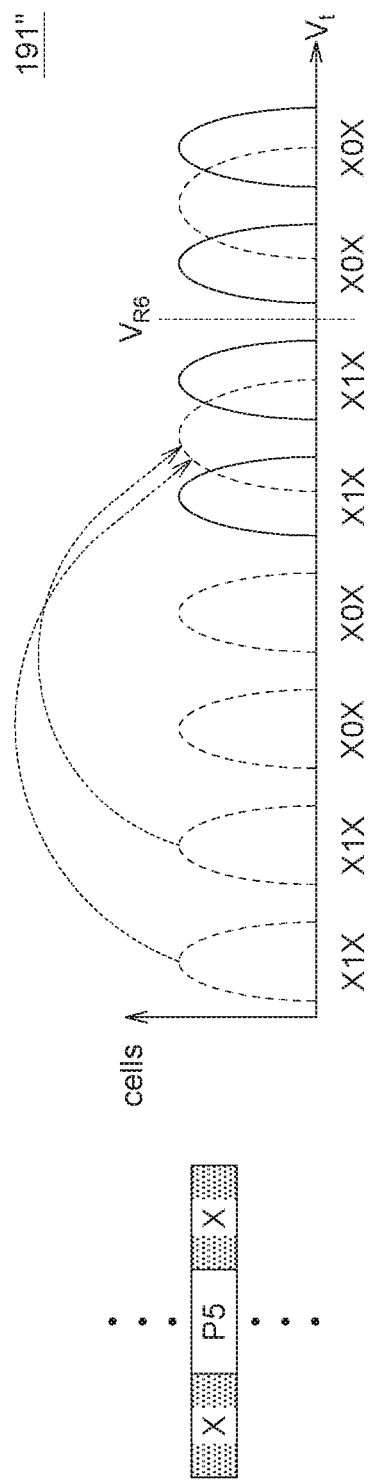

Please refer to FIGS. 11A-11C. In this embodiment, distribution 191 of FIG. 10A presents that high page P2, mid-page P5 and low page P9 of the second word line have been programmed with data. Distribution 191' in FIG. 11B presents the distribution of the memory cells of high page P2 and mid-page P5 of the second word line after low page P9 of the second word line has been sanitized and the data of high page P2 and mid-page P5 have been kept. Distribution 191" in FIG. 11C presents the distribution of the memory cells of mid-page P5 of the second word line after low page P9 of the second word line has been sanitized, then high page P2 of the second word line has been sanitized and the data of mid-page P5 has been kept. In FIG. 11B, when low page P9 would be sanitized but the data of high page P2 and mid-page P5 would be kept, the sanitizer 104 applies a second reading voltage $V_{R2}$ and a fourth reading voltage $V_{R4}$ to obtain two first target memory cells of the memory cells having the third logical state ("100") and the fourth logical state ("000") and two second target memory cells of the memory cells having the first logical state ("111") and the second logical state ("110"). Then, the sanitizer 104 applies a first programming voltage, by a ISPP, to change the logical state of the first target memory cell of the memory cells from the third logical state ("100") to the seventh logical state ("00X") with a higher threshold voltage and change the logical state of the first target memory cell of the memory cells from the fourth logical state ("000") to the seventh logical state ("00X") with a higher threshold voltage. Thus, the data written into low page P9 could be "deleted" and the data of high page P2 and mid-page P5 could be kept.

In FIG. 11C, when high page P2 would be sanitized but the data of mid-page P5 would be kept, the sanitizer 104 applies a second programming voltage, by a ISPP, to change the logical states of the second target memory cells of the memory cells from the first logical state ("11X") and the second logical state ("11X") to the fifth logical state ("X1X") with a higher threshold voltage. Thus, the data written into high page P5 could be "deleted" and the data of mid-page P2 could be kept.

The operations of applying the sanitizing voltage to triple-level cells are not limited to the above illustrated embodiments. A person having ordinary knowledge in the art should understand all kinds of operations of applying the sanitizing voltage to triple-level cells according to the above illustrated embodiments. It will be apparent that the present invention is not only applied to TLC, but also a memory in which each memory cell stores four or more bits.

According to embodiments of the present invention, a shot or a programming voltage, by ISPP, could be applied to memory cells of memory pages of memory blocks to change the logical states of the memory cells, program the logical states of the memory cells and change the data stored in the memory cells. Thus, the data of the memory cells is not read correctly, and the purpose of "deleting" data is achieved. In addition, the present invention could improve the data security of memory and prevent hackers from rebuilding data by obtaining data copies. The operation of "deleting" data for a particular page could be performed in the present invention. The user does not need to perform garbage collection and erase operations on the memory blocks which have particular pages storing data copies. The number of erasing memory blocks could be decreased and lifetime of the memory could be increased. When reading pages, the number of applying reading voltages could be reduced, and thus the performance of the memory could be improved. In addition, the logic state of the memory cell is sanitized to the fifth logic state, the sixth logic state, the seventh logic state or eighth logic state with a higher threshold voltage can prevent the problem on the deterioration of data retention characteristics or data retention time caused by lateral charge migration that easily occurs in conventional 3D TLC-type NAND flash memory, and thereby the reliability of the memory is improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A data management method for a memory, the memory including a plurality of memory pages, each of the memory pages including a plurality of memory cells, each of the memory cells includes a first storage bit in high page, a second storage bit in mid-page and a third storage bit in low page, the memory cells comprising a first logical state, a second logical state, a third logical state, a fourth logical state, a fifth logical state, a sixth logical state, a seventh logical state, and an eighth logical state with a threshold voltage from low to high, respectively, the data management method comprising:

receiving a data update command corresponding to a logical address, the logical address mapping to a physical address of a target memory page before receiving the data update command;

applying a first reading voltage and a second reading voltage to obtain at least a first target memory cell and at least a second target memory cell to be sanitized in the target memory page of the memory pages;

applying a first programming voltage to change the logical state of the first target memory cell to one of the fifth logic state, the sixth logic state, the seventh logic state and eighth logic state; and applying a second programming voltage to change the logical state of the second target memory cell to one of the fifth logic state, the sixth logic state, the seventh logic state and eighth logic state, wherein the first programming voltage is different from the second programming voltage.

2. The method according to claim 1, wherein applying the first programming voltage to change the logical state of the first target memory cell and applying the second programming voltage to change the logical state of the second target memory cell and comprise:

when the low page would be sanitized but the data of the high page and the data of the mid-page would be kept, applying the first programming voltage, by incremental step pulse programming (ISPP), to change the logical state of the first target memory cell of the memory cells from the third logical state to the eighth logical state; and applying the second programming voltage, by ISPP, to change the logical state of the second target memory cell of the memory cells from the fourth logical state to the seventh logical state.

3. The method according to claim 1, wherein applying the first programming voltage to change the logical state of the first target memory cell and applying the second programming voltage to change the logical state of the second target memory cell comprise:

when the mid-page would be sanitized but the data of the high page and the data of the low page would be kept, applying the first programming voltage, by ISPP, to change the logical state of the first target memory cell of the memory cells from the first logical state to the eighth logical state; and applying the second programming voltage, by ISPP, to change the logical state of the second target memory cell of the memory cells from the fourth logical state to the fifth logical state.

4. The method according to claim 1, wherein applying the first programming voltage to change the logical state of the first target memory cell and applying the second programming voltage to change the logical state of the second target memory cell comprise:
when the high page would be sanitized but the data of the mid-page and the data of the low page would be kept,
applying the first programming voltage, by ISPP, to change the logical state of the first target memory cell of the memory cells from the first logical state to the sixth logical state; and
applying the second programming voltage, by ISPP, to change the logical state of the second target memory cell of the memory cells from the second logical state to the fifth logical state.

5. The method according to claim 1, wherein applying the first programming voltage to change the logical state of the first target memory cell and applying the second programming voltage to change the logical state of the second target memory cell comprise:
when the mid-page and the low page would be sanitized but the data of the high page would be kept,
applying the first programming voltage, by ISPP, to change the logical states of three of the first target memory cells of the memory cells from the first logical state, the second logical state and the third logical state to the eighth logical state; and
applying the second programming voltage, by ISPP, to change the logical state of the second target memory cell of the memory cells from the fourth logical state to the fifth logical state, the sixth logical state or the seventh logical state.

6. The method according to claim 1, wherein applying the first programming voltage to change the logical state of the first target memory cell and applying the second programming voltage to change the logical state of the second target memory cell comprise:
when the high page and the low page would be sanitized but the data of the mid-page would be kept,
applying the first programming voltage, by ISPP, to change the logical states of two of the first target memory cells of the memory cells from the first logical state and the second logical state to the fifth logical state; and
applying the second programming voltage, by ISPP, to change the logical states of two of the second target memory cells of the memory cells from the third logical state and fourth logical state to the seventh logical state.

7. The method according to claim 1, wherein applying the first programming voltage to change the logical state of the first target memory cell and applying the second programming voltage to change the logical state of the second target memory cell comprise:
when the high page and the mid-page would be sanitized but the data of the low page would be kept,
applying the first programming voltage, by ISPP, to change the logical state of the first target memory cell of the memory cells from the first logical state to the sixth logical state; and
applying the second programming voltage, by ISPP, to change the logical states of three of the second target memory cells of the memory cells from the second logical state, the third logical state and the fourth logical state to the fifth logical state.

8. The method according to claim 1, wherein applying the first programming voltage to change the logical state of the first target memory cell and applying the second programming voltage to change the logical state of the second target memory cell comprises:
when the high page, the mid-page and the low page would be sanitized,
applying a programming voltage, by ISPP, to change the logical states of four of the target memory cells of the memory cells from the first logical state, the second logical state, the third logical state and fourth logical state to the logical state "0".

9. The method according to claim 1, wherein applying the first programming voltage to change the logical state of the first target memory cell and applying the second programming voltage to change the logical state of the second target memory cell comprise:
when the low page would be sanitized but the data of the high page and the data of the mid-page would be kept,
applying the first programming voltage, by ISPP, to change the logical states of two of the first target memory cells of the memory cells from the third logical state to the eighth logical state and from the fourth logical state to the seventh logical state; and
when the mid-page would be sanitized but the data of the high page would be kept,
applying the second programming voltage, by ISPP, to change the logical states of two of the second target memory cells of the memory cells from the first logical state and the second logical state to the eighth logical state.

10. The method according to claim 1, wherein applying the first programming voltage to change the logical state of the first target memory cell and applying the second programming voltage to change the logical state of the second target memory cell comprise:
when the low page would be sanitized but the data of the high page and the data of the mid-page would be kept,
applying the first programming voltage, by ISPP, to change the logical states of two of the first target memory cells of the memory cells from the third logical state and the fourth logical state to the seventh logical state with a higher threshold voltage; and
when the high page would be sanitized but the data of the mid-page would be kept,
applying the second programming voltage, by ISPP, to change the logical states of two of the second target memory cells of the memory cells from the first logical state and the second logical state to the fifth logical state with a higher threshold voltage.

11. A memory apparatus, comprising:
a memory array, including a plurality of memory pages, each of the memory pages including a plurality of memory cells, each of the memory cells including a first storage bit in high page, a second storage bit in mid-page and a third storage bit in low page, the memory cells comprising a first logical state, a second logical state, a third logical state, a fourth logical state, a fifth logical state, a sixth logical state, a seventh logical state, and an eighth logical state with a threshold voltage from low to high, respectively; and
a sanitizer, for receiving a data update command corresponding to a logical address, the logical address mapping to a physical address of a target memory page before receiving the data update command, and applying a first reading voltage and a second reading voltage to obtain at least a first target memory cell and at least a second target memory cell to be sanitized in the target memory page of the memory pages, and applying a first programming voltage to change the logical state of the first target memory cell to one of the fifth logic state, the sixth logic state, the seventh logic state and eighth logic state, and applying a second programming voltage to change the logical state of the second target memory cell to one of the fifth logic state, the sixth logic state, the seventh logic state and eighth logic state, wherein the first programming voltage is different from the second programming voltage.

12. The memory apparatus according to claim 11, wherein applying the first programming voltage to change the logical state of the first target memory cell and applying the second programming voltage to change the logical state of the second target memory cell and comprise:
when the low page would be sanitized but the data of the high page and the data of the mid-page would be kept,
applying the first programming voltage, by ISPP, to change the logical state of the first target memory cell of the memory cells from the third logical state to the eighth logical state; and
applying the second programming voltage, by ISPP, to change the logical state of the second target memory cell of the memory cells from the fourth logical state to the seventh logical state.

13. The memory apparatus according to claim 11, wherein applying the first programming voltage to change the logical state of the first target memory cell and applying the second programming voltage to change the logical state of the second target memory cell comprise:
when the mid-page would be sanitized but the data of the high page and the data of the low page would be kept,
applying the first programming voltage, by ISPP, to change the logical state of the first target memory cell of the memory cells from the first logical state to the eighth logical state; and
applying the second programming voltage, by ISPP, to change the logical state of the second target memory cell of the memory cells from the fourth logical state to the fifth logical state.

14. The memory apparatus according to claim 11, wherein applying the first programming voltage to change the logical state of the first target memory cell and applying the second programming voltage to change the logical state of the second target memory cell comprise:
when the high page would be sanitized but the data of the mid-page and the data of the low page would be kept,
applying the first programming voltage, by ISPP, to change the logical state of the first target memory cell of the memory cells from the first logical state to the sixth logical state; and
applying the second programming voltage, by ISPP, to change the logical state of the second target memory cell of the memory cells from the second logical state to the fifth logical state.

15. The memory apparatus according to claim 11, wherein applying the first programming voltage to change the logical state of the first target memory cell and applying the second programming voltage to change the logical state of the second target memory cell comprise:
when the mid-page and the low page would be sanitized but the data of the high page would be kept,
applying the first programming voltage, by ISPP, to change the logical states of three of the first target memory cells of the memory cells from the first logical state, the second logical state and the third logical state to the eighth logical state; and applying the second programming voltage, by ISPP, to change the logical state of the second target memory cell of the memory cells from the fourth logical state to the fifth logical state, the sixth logical state or the seventh logical state.

16. The memory apparatus according to claim 11, wherein applying the first programming voltage to change the logical state of the first target memory cell and applying the second programming voltage to change the logical state of the second target memory cell comprise:
when the high page and the low page would be sanitized but the data of the mid-page would be kept,
applying the first programming voltage, by ISPP, to change the logical states of two of the first target memory cells of the memory cells from the first logical state and the second logical state to the fifth logical state; and
applying the second programming voltage, by ISPP, to change the logical states of two of the second target memory cells of the memory cells from the third logical state and fourth logical state to the seventh logical state.

17. The memory apparatus d according to claim 11, wherein applying the first programming voltage to change the logical state of the first target memory cell and applying the second programming voltage to change the logical state of the second target memory cell comprise:
when the high page and the mid-page would be sanitized but the data of the low page would be kept,
applying the first programming voltage, by ISPP, to change the logical state of the first target memory cell of the memory cells from the first logical state to the sixth logical state; and
applying the second programming voltage, by ISPP, to change the logical states of three of the second target memory cells of the memory cells from the second logical state, the third logical state and fourth logical state to the fifth logical state.

18. The memory apparatus according to claim 11, wherein applying the first programming voltage to change the logical state of the first target memory cell and applying the second programming voltage to change the logical state of the second target memory cell comprises:
when the high page, the mid-page and the low page would be sanitized,
applying a programming voltage, by ISPP, to change the logical states of four of the target memory cells of the memory cells from the first logical state, the second logical state, the third logical state and fourth logical state to the logical state "0" with a higher threshold voltage.

19. The memory apparatus according to claim 11, wherein applying the first programming voltage to change the logical state of the first target memory cell and applying the second programming voltage to change the logical state of the second target memory cell comprise:
when the low page would be sanitized but the data of the high page and the data of the mid-page would be kept,
applying the first programming voltage, by ISPP, to change the logical states of two of the first target memory cells of the memory cells from the third logical state to the eighth logical state and from the fourth logical state to the eighth logical state and the seventh logical state; and
when the mid-page would be sanitized but the data of the high page would be kept,
applying the second programming voltage, by ISPP, to change the logical states of two of the second target memory cells of the memory cells from the first logical state and the second logical state to the eighth logical state.

20. The memory apparatus according to claim 11, wherein applying the first programming voltage to change the logical state of the first target memory cell and applying the second programming voltage to change the logical state of the second target memory cell comprise:
   when the low page would be sanitized but the data of the high page and the data of the mid-page would be kept,
   applying the first programming voltage, by ISPP, to change the logical states of two of the first target memory cells of the memory cells from the third logical state and the fourth logical state to the seventh logical state with a higher threshold voltage; and
   when the high page would be sanitized but the data of the mid-page would be kept,
   applying the second programming voltage, by ISPP, to change the logical states of two of the second target memory cells of the memory cells from the first logical state and the second logical state to the fifth logical state with a higher threshold voltage.

\* \* \* \* \*